(12) United States Patent
Perlegos et al.

(10) Patent No.: US 7,423,912 B2
(45) Date of Patent: Sep. 9, 2008

(54) SONOS MEMORY ARRAY WITH IMPROVED READ DISTURB CHARACTERISTIC

(75) Inventors: Gust Perlegos, Fremont, CA (US); Alan L. Renninger, Kapolei, HI (US); James Yount, Manitou Springs, CO (US); Maria Ryan, Tynemouth (GB)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/533,154

(22) Filed: Sep. 19, 2006
(Under 37 CFR 1.47)

(65) Prior Publication Data
US 2008/0068896 A1    Mar. 20, 2008

(51) Int. Cl.
*G11C 11/34* (2006.01)

(52) U.S. Cl. .............................. 365/185.24; 365/185.29

(58) Field of Classification Search ............ 365/185.24, 365/185.02, 185.22, 185.27, 185.29, 185.17, 365/185.33
See application file for complete search history.

(56) References Cited

U.S. PATENT DOCUMENTS

| | | | |
|---|---|---|---|
| 4,901,320 A * | 2/1990 | Sawada et al. ................ 714/15 |
| 5,602,776 A * | 2/1997 | Herdt et al. ............ 365/185.08 |
| 5,774,400 A * | 6/1998 | Lancaster et al. ........ 365/185.3 |
| 6,163,048 A * | 12/2000 | Hirose et al. ................ 257/315 |
| 6,580,103 B2 * | 6/2003 | Yi et al. ...................... 257/202 |
| 6,614,070 B1 * | 9/2003 | Hirose et al. ................ 257/316 |
| 6,819,590 B2 * | 11/2004 | Goda et al. ............ 365/185.03 |
| 2003/0224564 A1 * | 12/2003 | Kang et al. .................. 438/200 |
| 2005/0142757 A1 | 6/2005 | Lee et al. |
| 2005/0237815 A1 * | 10/2005 | Lue et al. ............... 365/185.28 |
| 2006/0079055 A1 | 4/2006 | Yang |
| 2006/0209593 A1 * | 9/2006 | Toda ..................... 365/185.03 |

FOREIGN PATENT DOCUMENTS

WO    2005062378 A1    7/2005

OTHER PUBLICATIONS

A new 40-nm SONOS Structure Based on Backside Trapping for Nanoscale Memories, Ranica et al., Sep. 2005, IEEE transactions on Nanotechnology, vol. 4, No. 5.*
Fully Integrated SONOS Flash Memory Cell Array with BT (Body Tied)-FinFET Structure, Sung et al., May 2006, IEEE Transactions on Nanotechnology, vol. 5, No. 3.*

(Continued)

*Primary Examiner*—Huan Hoang
*Assistant Examiner*—Fernando N Hidalgo
(74) *Attorney, Agent, or Firm*—Schwegman, Lundberg & Woessner, P.A.

(57) ABSTRACT

A PMOS non-volatile memory array using SONOS transistors having program and erase threshold voltages for representing digital logic states of zero and one and selected to optimize read disturb characteristics. The threshold voltages are linearly convergent and separated by at least 0.5 volts for a charge retention time of at least 10 years, with the threshold voltages defining a window wherein a read voltage for selected memory transistors can be held flat and not intersect the threshold voltages. The lower threshold is selected to be at a zero charge state for one of the two logic levels of the memory.

8 Claims, 3 Drawing Sheets

OTHER PUBLICATIONS

M. Slotboom et al., "Low Voltage and Low Power Embedded 2T-SONOS Flash Memories", Philips Research, Leuven, Belgium, pp. 231-233.

R. Van Schaijk et al., "SONOS Flash Memories with HfO2 or HfSiON", Philips Research, Leuven, Belgium, pp. 219-221.

M.H. White et al., "Characterization of Scaled SONOS EEPROM Memory Devices for Space and Military Systems", IEEE, (c), 2004, pp. 51-59.

D. Adams et al., "SONOS Technology for Commercial and Military Nonvolatile Memory Applications", IEEE, 1999, pp. 96-99.

S.K. Sung et al., "Fabrication and Program/Erase Characteristics of 30-nm SONOS Nonvolatile Memory Devices", IEEE, 2003, pp. 258-264.

I. Cho et al., "Fabrication and Characteristics of P-channel silicon-oxide-nitride-oxide-silicon Flash Memory Device Based on Bulk Fin Shaped Field Effect Transistor Structure", J. Vac. Sci. Technol., vol. 24, Iss. 3, May 2002, pp. 1266-1270.

* cited by examiner

SONOS MEMORY ARRAY WITH IMPROVED READ DISTURB CHARACTERISTIC

TECHNICAL FIELD

The invention relates to non-volatile semiconductor memories, and in particular to SONOS memories.

BACKGROUND ART

SONOS memory devices are electrically erasable programmable memory transistors wherein charge is stored in a nitride trap layer that is insulated from a substrate on one side and insulated from a select gate on another side. For example, such devices are described in "Characterization of Scaled SONOS EEPROM Memory Devices for Space and Military Systems" by M. White et al., IEEE 2004 p. 51-59. This paper describes device parameters, including retention time, in terms of various physical properties of devices. In NMOS SONOS cells an N-channel is formed in a P-well with the majority charge carriers being electrons. Charge is moved into nitride traps in the trap layer by various charge transfer mechanisms, such as hot electron transfer or Fowler-Nordheim ("FN") tunnelling. Similarly, in PMOS SONOS cells a P-channel is formed in an N-well with the majority charge carriers being holes. The nitride traps are less vulnerable to charge leakage due to insulator failure than conventional floating gates because traps that are spatially localized are employed. Thus, a local failure of nearby insulator material may affect some traps but not all traps.

SONOS memory devices have good charge retention over a period of time for the reason mentioned. Charge loss can occur because a relatively thin bottom oxide is required for reasonable programming times. Charge loss can be accommodated by simply making the initial programmed threshold high enough so that after some period of time, say 10 years, the threshold remains high enough that the cell is still programmed. But even with good charge retention, there is some degradation of threshold voltages such that separation of characteristic threshold voltages is not so great after a number of years compared to the time of manufacture, leading to read errors. This creates a smaller window for a read voltage that must be within the window defined by the two threshold voltages. Once the read voltage is outside of the window, the transistor is no longer useful because of read errors unless the read voltage is somewhat adjusted or re-positioned within the window.

An object of the invention is to devise a SONOS memory device having improved read disturb characteristics that reduce read errors over a long period of time.

SUMMARY OF INVENTION

The above object has been met with a SONOS memory transistor designed for a memory cell where threshold voltages are projected into the future by linear extrapolation and one of the threshold voltages, preferably the erase threshold is selected to be a voltage associated with no charge in the nitride traps. The other threshold voltage is convergent on the first threshold voltage. The convergent threshold voltages, namely the voltage between program threshold voltage and the erase threshold voltage form a window of decreasing size but is set to be at least 0.5 volts in 10 years, notwithstanding charge loss. In the window between the program and erase threshold voltages a read voltage associated with sense amplifier is uniform and less subject to read disturb voltages.

In one example, in a SONOS memory transistor having the window described above, one of the two threshold voltages (a first threshold for transistor programming and a second threshold for transistor erasing) is kept flat while the read voltage is also flat in the window between the two threshold voltages. In a PMOS configuration, the threshold voltage for the erase state is the lowest voltage and is kept flat while holding the SONOS transistor voltage neutral for the erase state. In other words, the programmed and erased threshold levels of a SONOS cell can be chosen such that one of them is a neutral state in which there is no charge in the storage medium. For PMOS, it is advantageous that this state be the one with the lowest threshold, i.e., the erase threshold, since raising the threshold for programming the cell then requires the tunneling of electrons to the storage layer while lowering the threshold to the neutral state or erasing the cell would require the tunneling of holes to the storage layer which requires much higher voltages or longer times. This is because the barrier for injection of holes from the substrate through the tunnel oxide is higher and the effective mass of holes in silicon is higher. In this way the programming of the cell that needs to be done on a bit by bit basis can be done relatively quickly while erasing the cell which can be done for many bits at a time can be done more slowly in a flash memory array.

A principal problem faced in memory arrays is read disturb, a situation where the read voltage applied to a cell disturbs the charge stored in the same cell or a nearby cell. In the case of a PMOS memory cell, both of the program and erase threshold can be negative with respect to the N-well in which the PMOS transistor is placed. In this case the read voltage will be a negative voltage between the program and erase states. This will favor hole injection and so will be less susceptible to read disturb voltages.

The problem of disturb is even worse in a NAND array in which a series of cells are places in a stack and a given cell must be read through the cells which are above it in the stack. That is, cells which are in the non-conducting state must be turned on if they are above the selected cell in the stack. To do this a voltage, called an override voltage, must be applied which is greater than the threshold of these non-conducting cells. This requirement means that is such an array some cells will be subjected to even more read disturb. In an NMOS NAND array the override voltage will need to be a high positive voltage thus exacerbating the read disturb. Due to the need to have non-conducting cell thresholds high enough to account for retention loss, this voltage will need to be quite high. Thus read disturb becomes an even bigger concern. However in a PMOS cell the override voltage will be quite negative since in this cell the non-conducting state is the low threshold state and is not subject to charge retention concerns. For a PMOS cell the unselected read gate voltage will be the most positive but even this can be 0 volts. Thus a PMOS SONOS non-volatile memory cell will be less susceptible to disturb both in normal read and when reading in a NAND configuration.

In a NAND memory, a second advantage for a PMOS cell is that the lowest threshold state will be the non-conducting state which must be overridden during read. Since this threshold is the one which is not subject to charge loss, the override voltage in a PMOS cell can be a fixed value with the smallest possible magnitude.

DESCRIPTION OF INVENTION

Figure 1:
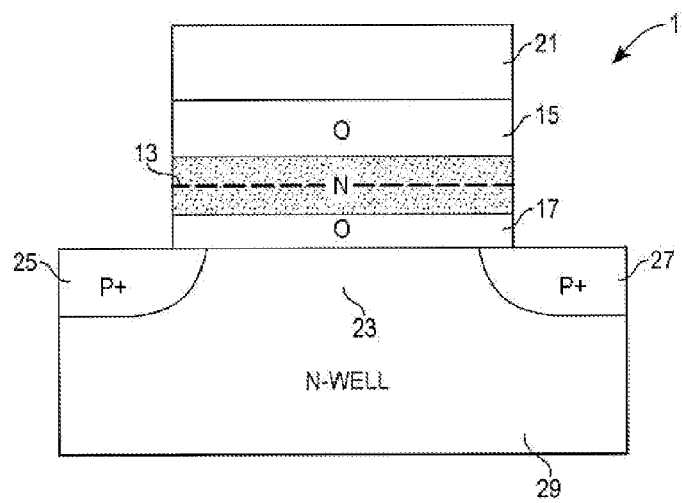
FIG. 1 is a side diagrammatic view of a SONOS PMOS memory transistor in accordance with the present invention for use in a memory array.

With reference to FIG. 1, a SONS non-volatile memory (NVM) cell 11 can be made by inserting a nitride trap storage layer 13 between the gate oxide layers 15, 17 to form a floating gate EEPROM transistor in the usual way. The top electrode 21 is usually conductive polysilicon. A channel 23 is formed between source 25 and drain 27 in N-well 29. Such a non-volatile memory cell 11 has advantages in terms of process simplicity and insensitivity to defects compared to more conventional floating gate cells due to the discrete nature of the trap storage locations within the nitride layer. The construction of such a cell has been widely discussed over the past several years. One method of programming and erasing such a cell consists of utilizing FN tunneling, modified FN tunneling, or direct tunneling by applying the appropriate biasing across the gate oxide layer 17. This method allows for low currents during programming which can be advantageous, especially in low power applications such as embedded memories. With voltages of 10-12 volts a threshold shift of 2 volts or more can be obtained when the bottom oxide is around 30 Å in thickness.

Electrons must be tunneled into the nitride traps of the storage layer 13 to raise the threshold of the cell 11 and holes must be tunneled to lower the threshold of the cell. For electron tunneling from the substrate the bias between the gate of the cell 11, found in top or gate electrode 21, and the channel 23 must be positive while for hole tunneling from the substrate it must be negative. Electron tunneling in a SONOS cell requires much lower electric fields than does hole tunneling due to the relatively lower barrier to injection of electrons. If the cell is made in an N-type substrate 29 or Nwell, a PMOS cell 11 will result in which the low threshold state will be the non-conducting erase state and the conducting program state will have the higher threshold.

For example, a typical thickness for lower gate oxide layer 17 can be in the range of 20 Å to 30 Å. The thickness of the nitride tap layer 13 can be in the range of 50 Å to 100 Å and the thickness of upper gate oxide layer 15 can be in the range of 50 Å to 100 Å. The polysilicon gate layer 21 can have a thickness in the range of 1500 Å to 4000 Å. The lower gate oxide thickness can be determined by the program and erase times and the retention time desired. Thicker oxide improves retention but requires longer program and erase times. The upper gate oxide can be determined by the voltage which can be supplied to the cell and by the requirement that there not be any electron tunneling through that oxide during erase. The nitride thickness can be determined again by the voltage available on the chip and, perhaps also by the size of the program or erase window which is needed.

Figure 2:
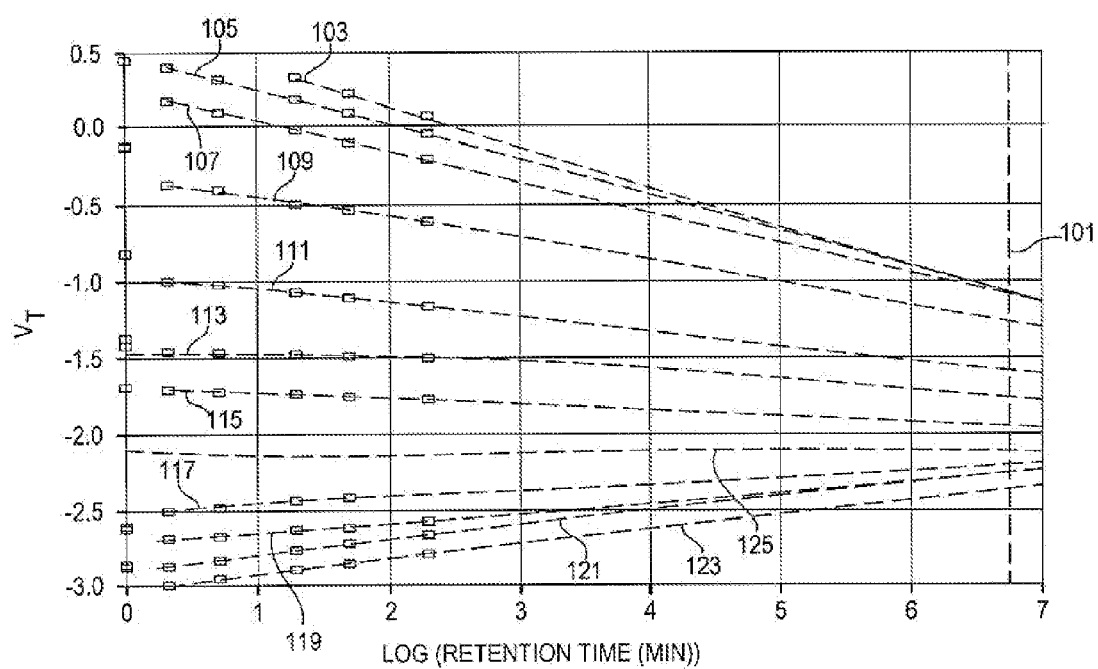
FIG. 2 is a plot of log retention time (x) versus program and erase threshold voltages (y) for a device as shown in FIG. 1, with retention time linearly extrapolated.

With reference to FIG. 2, program and erase threshold voltage are plotted with respect to retention time for a PMOS SONOS transistor. The Y (vertical) axis shows threshold voltages. The X axis shows the log of charge retention time in minutes. The top seven downwardly sloping curves 103-115 represent the programming threshold voltage with respect to charge retention time. The negative slope represents negative charge, i.e., electrons in the nitride traps. States with positive charge, i.e., excess holes, will decay with positive slope. The small rectangles on the curves are measured and plotted data points. Theses retention time curves are linear extrapolations from the points that are plotted, as shown. A ten year retention time is indicated by vertical line 101. The downwardly sloping lines 103-115 represent various programming threshold voltages. Similarly the upwardly sloping lines 117-123 represent various erase threshold voltages. These thresholds are such that one threshold selected for use has an associated zero charge in the nitride traps so that the nitride traps cannot lose charge over time. Any manufacturing process will have curves specific to the process. Once the desired characteristic threshold curves are found, the process is frozen.

A pair of threshold voltages, one for programming and one for erasing is selected with a separation of at least 0.5 volts at line 101, the ten year estimated data retention line. For example, selection of programming threshold line 111 and selection of any of the erase threshold lines, say line 117, has a separation of at least 0.5 volts at line 101. These two lines define a window within which the logic state of the transistor may be sensed by a read voltage from sense amplifiers.

Figure 3:
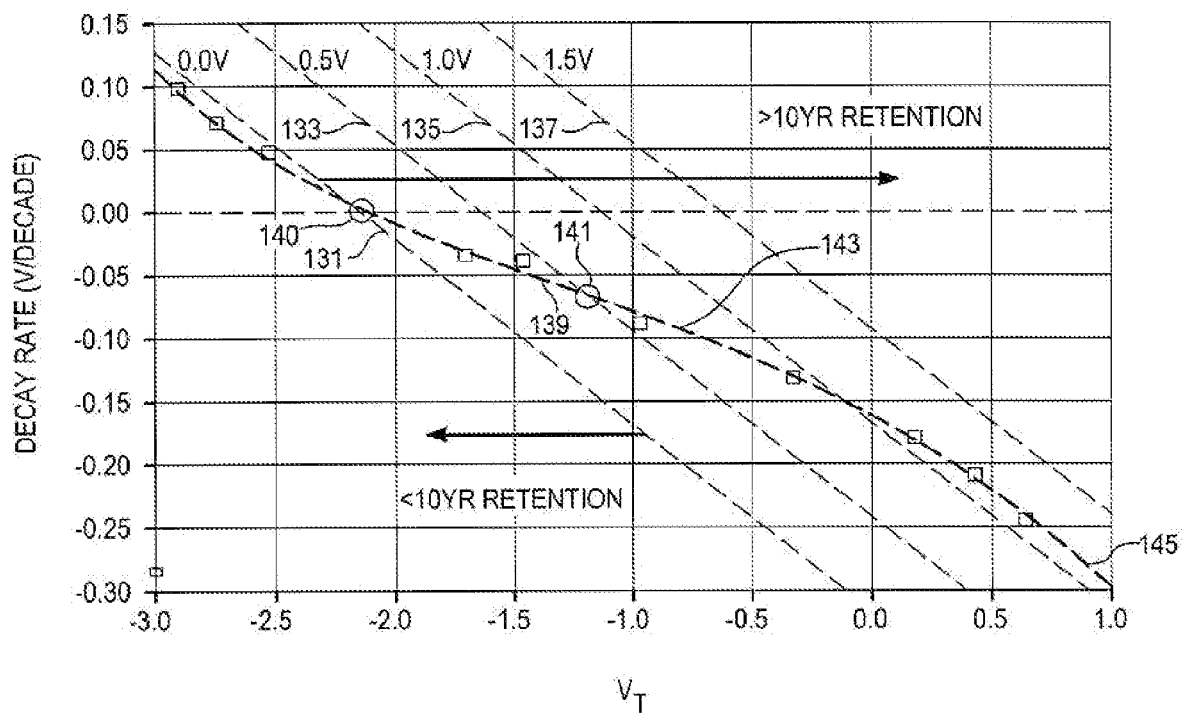
FIG. 3 is a plot of the threshold voltages versus charge decay rates from FIG. 2 for the transistors shown in FIG. 1.

Charge is lost by the programmed state at a decay rate that is predictable. In FIG. 3, the diagonal lines 131-137 represent various $V_T$ windows at 10 years charge retention time. The $V_T$ window is the program state $V_T$ less the erase state $V_T$ for windows of 0, 0.5, 1, and 1.5V. To the left of the zero window line 131 is less than 10 years charge retention and to the right is greater than 10 years charge retention. For each diagonal line, there is a range of decay rates, shown on the Y axis. The point 140 on curve 139 where the fitted data provides a slope of zero represents the erase state threshold $V_T$. The slope of zero means that there is no $V_T$ erase threshold decay, i.e., a flat retention behavior, because there is no charge in the nitride. This is the device behavior selected in the present invention. Note that for the tested device illustrated in FIG. 2, the flat retention behavior is illustrated by line 125, and in this representative example, the preferred erase state threshold voltage is −2.1 V. The erase state threshold voltage can vary below this level by say 50% but not above this level because a value above impacts the window defined between the program and erase thresholds.

The maximum window at 10 years retention time for this representative device is about 1.2V, as characterized by the data points of FIG. 3, indicated by saturation regions 145. For a window with a threshold difference of 0.5 volts, as shown by curve 133, after 10 years, the decay rate is about minus 0.06 volts per decade for a transistor with an initial upper threshold or programming threshold voltage at minus 1.2 volts, indicated by point 141 in FIG. 3. Other decay rates can be found for other windows between 0.5 and 1.2 volts for the transistor of this example.

Figure 4:
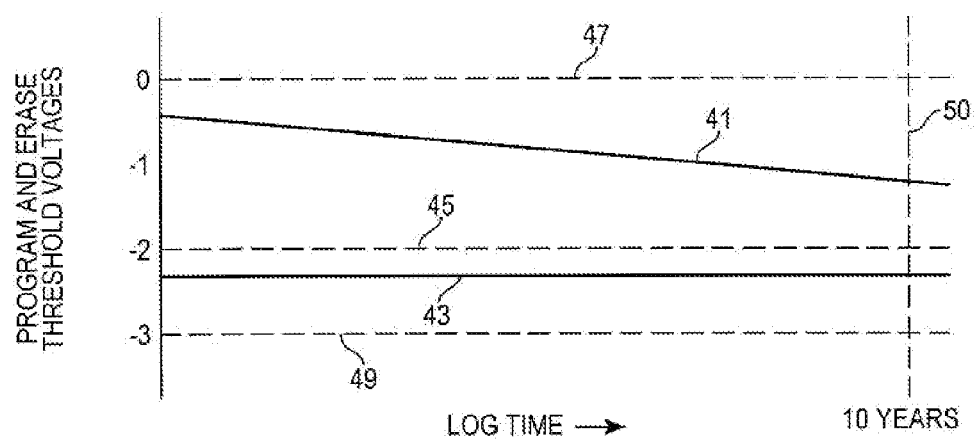
FIG. 4 is a plot of voltages for desired charge retention performance over a long time for devices of the type shown in FIG. 1.

With reference of FIG. 4, two threshold voltage curves are seen in this exemplary embodiment of the invention based upon threshold curves similar to those shown in FIG. 2. All voltages shown may have small variations. Plot 41 is the threshold for programming, while plot 43 is the threshold for erasing, both extrapolated linearly to charge retention times on a logarithmic scale beyond 10 years. Plot 45 is the read voltage for selected memory cells in an array. Plot 47 is the read voltage for unselected memory cells in an array. All plots extend from the time of manufactures, T=0, to at least a later charge retention time of 10 years from time of manufacture represented by vertical dashed line 50. Note that the erase threshold voltage 43 has a zero slope or flat erase threshold voltage, similar to curve 125 in FIG. 2. The program threshold 41 slopes downwardly and is convergent toward threshold 43 over the 10 year period, with the space between the two thresholds defining a window for the read voltage applied to the gate of the memory transistor $V_G$ (read, select). This voltage is flat for more than 10 years, represented by line 45, and is within about 0.4 volts to 1.0 volts of the lower or erase threshold voltage 43. Since the erase threshold voltage is also flat, the read voltage can be even closer to the erase threshold and still be in the window. A minimum recommended separation for the read voltage from the erase threshold is 0.1 volts over at least a ten year charge retention time. With this voltage, the read voltage $V_G$ (read, select) on line 45 is within the window at least over 10 years. Typical program erase and read voltages for the PMOS SONOS all are as shown in the following table.

|  | Program | Erase | Read |
| --- | --- | --- | --- |
| Nwell | 0 V | 12 V | 4 V |
| Source | 0 | 12 V | 4 V |
| Drain | 0 | 12 V | 3 V |
| Gate | 12 V | 0 | 2 V |

These values are plus or minus two volts for program and erase and plus or minus 0.5 volts for read.

In a PMOS NOR memory configuration, programmed cells have a gate voltage such that erased cells are off. As shown in FIG. 4, this is line 47, 0 volts. The read voltage, line 45, is a negative voltage between the programming threshold and the erase threshold voltage levels 41 and 43, respectively. This will favor hole injection and is much less susceptible to disturb. It will be necessary to control the programming or on-state threshold level 41 such that it does not become greater than 0 volts but since this involves electron tunneling it is an inherently fast process and so an iterative approach becomes much more feasible.

Figure 5:
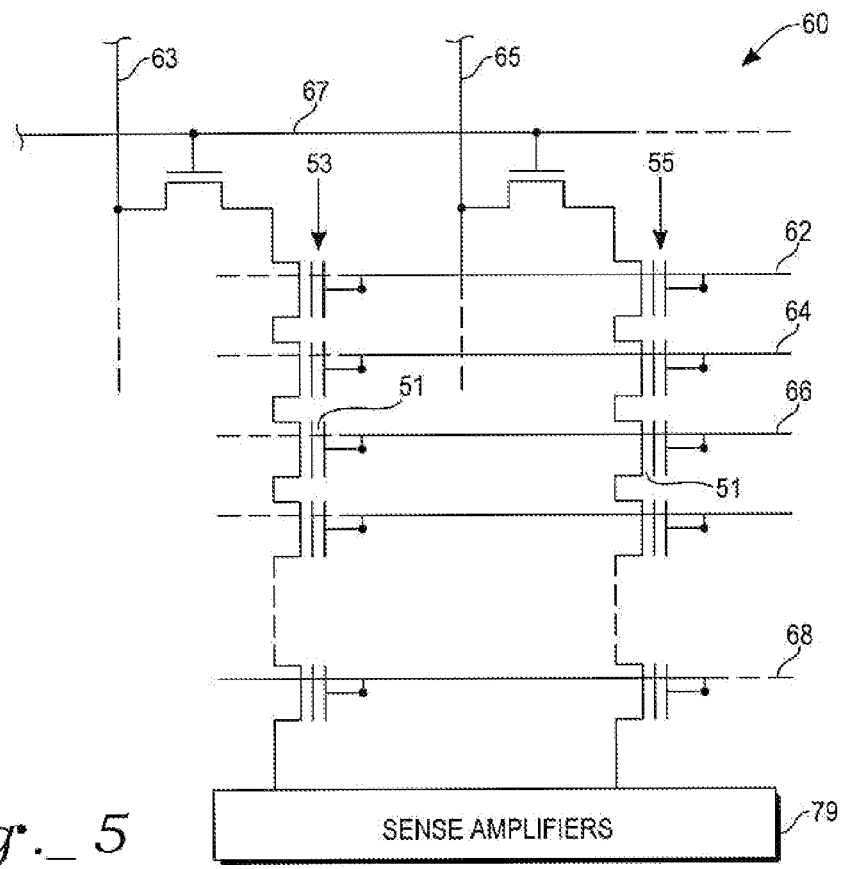
FIG. 5 is a partial schematic drawing of a NAND flash memory array using transistors of FIG. 1 with the threshold voltages of the present invention.

In the NAND array 60 of FIG. 5 a series of cells 51 are placed in stacks 53, 55 along the bitlines 67, 63, 65, respectively. Word lines 62, 64, 66, 68 are used to apply gate voltages. In order to read a selected cell all the other cells in the column must be turned on. To do this a voltage, called an override voltage, line 49 in FIG. 4, must be applied which is greater than the threshold of these non-conducting cells. For an NMOS cell the override voltage will need to be a high positive voltage thus exacerbating the read disturb on the non-selected cells. However, in a PMOS cells this override voltage will be quite negative since in this case the non-conducting state is the low threshold state. Thus a PMOS SONOS non-volatile memory cell will be less susceptible to read disturb both in a NAND configuration, as well as a NOR configuration.

Thus PMOS cells have an inherent advantages when used for SONOS arrays in that they can be operated in such a way that disturb, which is a major concern for SONOS cells, is substantially reduced. In addition the state which must be more carefully controlled is the one involving electron programming which is much faster. Finally the use of a PMOS cell for SONOS arrays allows the erase threshold state to be chosen as the charge neutral state, i.e., a specific logic state. Depending on film thickness and voltages, one of three modes of charge transfer may be used including direct tunneling, FN tunneling or modified FN tunneling.

Figure 6:
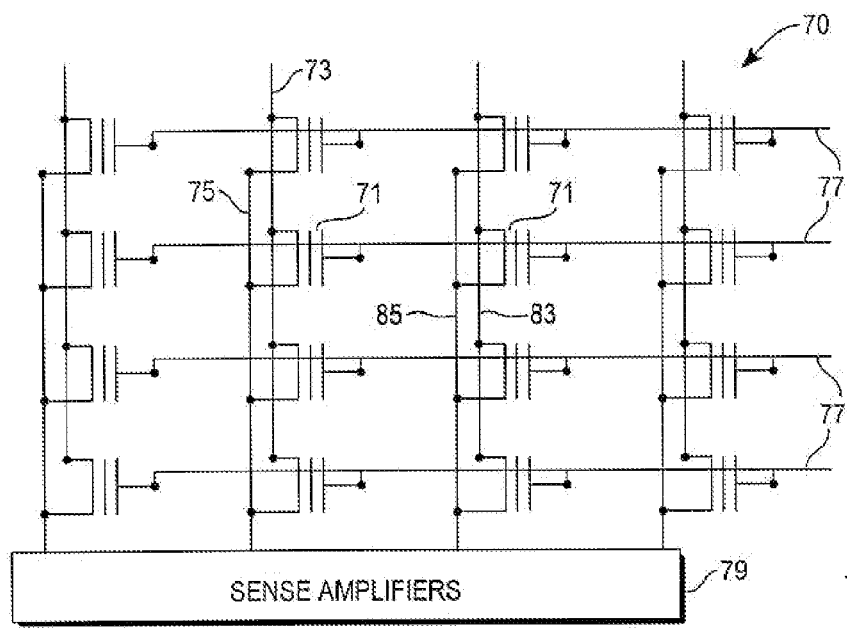
FIG. 6 is a partial schematic drawing of a NOR flash memory array using transistors of FIG. 1 with the threshold voltages of the present invention.

In the NOR memory array 70 configuration of FIG. 6, each cell 71 has its own bitline contacts 73, 75 and 83, 85 respectively, allowing bits to be accessed independently of other bits. In the case of reading one cell within an array of cells in a NOR configuration, it is necessary that some means be available whereby only the selected cell and not the non-selected cells which have been erased contribute to the current in the bitline. A voltage is applied to the unselected cells which will cause erased cells to be off. The best choice for this voltage is 0 since this avoids any potential disturb issues on these non-selected cells. Since in our PMOS cell of FIG. 1 both the program the erase thresholds are negative with respect to the N-well, the gate voltage for the unselected cells can again be 0 such that no matter what the state, the unselected cells do not conduct. Returning to FIG. 6, gate voltages are applied on a word line 77. Sense amplifiers 79 read the state of the addressed memory cell with a read voltage level.

What is claimed is:

1. A non-volatile memory array comprising:
    a plurality of PMOS SONOS non-volatile memory transistors arranged in an array of memory cells with a single SONOS transistor in each memory cell, each transistor having an upper programming threshold characteristic line with respect to charge retention time and a lower erase threshold characteristic line with respect to charge retention time that is a charge neutral flat characteristic line, the lines being separated by at least 0.5 volts at a retention time of 10 years and mutually convergent over the retention time, thereby defining a window, the programming and erase threshold characteristic line being negative over the retention time; and
    sense amplifier means for generating a read voltage represented by a characteristic line that is linear in said window with respect to retention time and is located at least 0.1 volts above the lower characteristic line at the retention time of 10 years.

2. A method of making a PMOS SONOS flash integrated circuit memory array comprising:
    Providing a PMOS SONOS memory array having memory cells with a single SONOS transistor in each memory cell;
    specifying negative transistor program and erase threshold voltages for non-volatile PMOS SONOS memory transistors in an array relative to projected charge retention time; and
    selecting the negative program and erase threshold voltages to converge with a separation greater than 0.5 volts for a charge retention time exceeding ten years, thereby defining a window for read voltage between the selected program and erase thresholds that exists for at least ten years.

3. The method of claim 2 further defined by projecting the program and erase threshold voltages as a linear extrapolation for the logarithm of charge retention time.

4. The method of claim 2 further defined by selecting a read voltage to be held flat in said window for the charge retention time exceeding 10 years.

5. The method of claim 2 further defined by configuring the array as a NAND array.

6. The method of claim 2 further defined by configuring the array as a NOR array.

7. The method of claim 2 further defined by selecting an erase threshold voltage that is flat over a charge retention time of at least 10 years.

8. The method of claim 2 further defined by selecting a read voltage that is flat over a charge retention time of at least 10 years.

\* \* \* \* \*

UNITED STATES PATENT AND TRADEMARK OFFICE
CERTIFICATE OF CORRECTION

PATENT NO. : 7,423,912 B2
APPLICATION NO. : 11/533154
DATED : September 9, 2008
INVENTOR(S) : Perlegos et al.

It is certified that error appears in the above-identified patent and that said Letters Patent is hereby corrected as shown below:

In column 1, line 47, delete "somewhat" and insert -- somehow --, therefor.

In column 2, line 33, delete "threshold" and insert -- thresholds --, therefor.

In column 2, line 40, delete "places" and insert -- placed --, therefor.

In column 2, line 46, delete "that is" and insert -- that in --, therefor.

In column 3, line 22, delete "SONS" and insert -- SONOS --, therefor.

In column 3, line 56, delete "tap" and insert -- trap --, therefor.

In column 4, line 2, delete "voltage" and insert -- voltages --, therefor.

In column 4, line 11, delete "Theses" and insert -- These --, therefor.

In column 4, line 58, delete "reference of" and insert -- reference to --, therefor.

In column 4, line 66, delete "manufactures," and insert -- manufacture, --, therefor.

In column 5, line 15, delete "program" and insert -- program, --, therefor.

In column 5, line 49, delete "cells" and insert -- cell --, therefor.

UNITED STATES PATENT AND TRADEMARK OFFICE
CERTIFICATE OF CORRECTION

PATENT NO.       : 7,423,912 B2
APPLICATION NO.  : 11/533154
DATED            : September 9, 2008
INVENTOR(S)      : Perlegos et al.

It is certified that error appears in the above-identified patent and that said Letters Patent is hereby corrected as shown below:

In column 5, line 55, delete "advantages" and insert -- advantage --, therefor.

In column 6, line 10, delete "the erase" and insert -- and erase --, therefor.

Signed and Sealed this

Ninth Day of December, 2008

JON W. DUDAS
*Director of the United States Patent and Trademark Office*